United States Patent [19]
Cottrell et al.

[11] 4,382,229
[45] May 3, 1983

[54] CHANNEL HOT ELECTRON MONITOR

[75] Inventors: Peter E. Cottrell; Ronald R. Troutman, both of Essex Junction, Vt.

[73] Assignee: International Business Machines Corporation, Armonk, N.Y.

[21] Appl. No.: 210,937

[22] Filed: Nov. 28, 1980

[51] Int. Cl.³ .......................................... G01R 31/22
[52] U.S. Cl. ................................................. 324/158 T
[58] Field of Search ............ 324/158 R, 158 T, 158 D, 324/73 R

[56] References Cited

PUBLICATIONS

"Characterization of Electronic Gate Current in IGFET's Operating in the Linear and Saturation Regions" by P. E. Cottrell et al, 1977, Device and Research Conference, Jun. 1977.
"IGFET Hot Electron Emission Model", by A. Phillips, Jr. et al, 1975 IEDM Digest Paper 3.3, pp. 39-42.
"Optically Induced Injection of Hot Electrons into SiO2", by T. H. Ning et al, Journal of Applied Physics, Dec. 1974, pp. 5373-5378.
"Threshold Instability in IGFET's Due to Emission of Leakage Electrons from Silicon Substrate Into Silicon Dioxide", by T. H. Ning et al, Applied Physics Letter, Aug. 1, 1976, pp. 198-200.
"Hot-Electron Emission in N-Channel IGFET's", by P. E. Cottrell et al, 1979 IEEE, pp. 442-454.
"Substrate Current-A Device and Process Monitor", by S. A. Abbas, 1974, IEDM Paper 17.7, pp. 404-407.
IBM TDB, vol. 18, #8, Jan. 1976, p. 2455, "Detection of Hot-Electron Injection and Trapping in FET Devices", by El-Kareh et al.
IBM TDB, vol. 19, #6, Nov. 1976, pp. 2119-2120, "MOSFET Hot-Electron Effect Characterization", by E. Kriese et al.
IBM TDB, vol. 19, #5, Oct. 1976, pp. 1632-1633, "Hot Electron Monitor", by A. H. Auriemma et al.

Primary Examiner—Ernest F. Karlsen
Attorney, Agent, or Firm—Francis J. Thornton

[57] ABSTRACT

This teaches that by measuring the rate of change in gate current of an insulating gate field effect transistor, under normal operating conditions, the time required to achieve a predetermined change in source-to-drain current in the transistor can be found. Because changes in gate current depends more on sensitivity on charge trapping in the oxide than do changes in channel current, and since the gate current occurs only in the small region of electron emission, the effects on gate current are more quickly developed than the secondary effect of reduced channel current due to the charge in gate oxide caused by the presence of trapped electrons.

3 Claims, 4 Drawing Figures

CHANNEL HOT ELECTRON MONITOR

FIELD OF THE INVENTION

This invention relates to field effect transistors and more particularly to a means of determining, in a minimal period of time, the long term effects of normal operating conditions on characteristics of the transistor.

BACKGROUND OF THE INVENTION

It has long been known that a relationship exists between the measured initial gate current and threshold shift of a transistor particularly for transistors under high stress conditions.

The papers, "Characterization of Electronic Gate Current in IGFET's Operating in the Linear and Saturation Regions", P. E. Cottrell et al, 1977 Device Research Conference, Ithaca, New York, June 1977, "Hot-Electron Emission in N-Channel IGFET's", P. E. Cottrell et al, IEEE Journal of Solid-State Circuits, April 1979, and "Hot-Electron Design Considerations for High Density RAM Chips", R. R. Troutman et al, IEEE Transactions on Electron Devices, Vol. ED-27, pp. 1629-1639, August 1980, teach that a correlation exists between the measured initial gate current and long term device threshold degradation.

In "IGFET Hot Electron Emission Model", A. Phillips, Jr., et al, 1975 *IEDM Digest*, paper 3.3, pages 39-42 apparently teaches that if gate current could be measured, as opposed to being calculated via a model, threshold voltage shifts could be determined. This paper indicated what the expected threshold shift would be over a matter of days based on calculated emission current for a stressed device.

An article, "Optically Induced Injection of Hot Electrons in SIO$_2$", Ning and Yu, *Journal of Applied Physics*, December 1974, pages 5373-5378, teaches that, under radiant energy stimulation of free carriers, hot electrons injected into the gate dielectric can be measured by monitoring gate current. The article also implies that, if trapping efficiency for a particular structure is known, threshold voltage shift might be determined by gate current as a function of time.

"Threshold Instability in IGFET's Due to Emission of Leakage Electrons from Silicon Substrate Into Silicon Dioxide", by Ning, Osburn and Yu, *Applied Physics Letters*, Aug. 1, 1976, pages 198-200, teaches that if the number of hot electrons injected is small compared with the dielectric trap density then the threshold shift rate is proportional to the emission current density. Here, as in the Phillips et al article, actual gate current was too small to be measured directly.

"Substrate Current-A Device and Process Monitor", Abbas, 1974 IEDM, paper 17.7, pages 404-407. "Detection of Hot-Electron Injection and Trapping in FET Devices", El-Kareh et al, *IBM Technical Disclosure Bulletin*, January 1976, pages, 2455-2456. "Hot Electron Monitor" Auriemma et al *IBM Technical Disclosure Bulletin*, October 1976, pages 1632-1633. "MOSFET Hot-Electron Effect Characterization", Kriese et al, *IBM Technical Disclosure Bulletin*, November 1976, pages 2119-2120 also teaches general monitoring techniques for studing hot-electron effects.

The above prior art, at best, only teaches that a relationship exists between the measured initial gate current and threshold shift of a transistor particularly for transistors under high stress.

The present invention is clearly distinguishable from this prior art, for it teaches that the rate of change of gate current in a transistor under normal operating conditions can be measured and that this rate of change can be used to determine, over a very short period of time, the long term threshold shift.

SUMMARY OF THE INVENTION

Broadly speaking, the invention thus teaches a method of measuring the initial rate of change in gate current, in an insulating gate semiconductor field effect transistor, (IGFET) under normal operating conditions and determining from that measurement the time required to achieve a predetermined change in source-drain current in the transistor.

More particularly the present invention teaches a method of determining the time to a predetermined threshold shift in a field effect transistor due to hot electron trapping in the gate dielectric comprising biasing the gate and drain electrodes of the transistor at a voltage with respect to the source electrode within the normal operating range, and measuring the decrease in gate current with respect to time.

This method allows very fast, i.e. less than 10 seconds, characterization of a long term decrease in field effect transistor channel current.

Thus this invention describes a monitoring technique for determining the long term threshold shift caused by trapping of low level avalanche injection of hot electrons in the gate dielectric at the drain end of the channel of an IGFET under high drain voltage. The technique consists of measuring the change in gate current over a short period of time and then extrapolating that change to a long term threshold shift based on previously calculated curves. Because changes in gate current are a more localized effect of oxide trapping and since the gate current occurs only in the small region of electron emission, the effects on threshold shift are more quickly developed than the secondary effect of reduced channel current due to the change in gate field caused by the presence of electrons in the oxide.

DESCRIPTION OF THE PREFERRED EMBODIMENT

Advances in silicon fabrication technology continue to make ever smaller IGFET device dimensions possible. However it has also been found that reductions in lateral dimensions must be accompanied by some combination of increased surface concentration, decreased insulator thickness, and decreased junction depth to prevent increased field spreading with its consequent shortchannel threshold and punch-through effects. Unless the operating voltages are reduced accordingly, appreciable emission of hot electrons from the silicon substrate into the gate insulator layer occur in these high-density devices. The subsequent trapping of the emitted electrons in the gate insulator can result in threshold-voltage instability and/or transconductance degradation.

Figure 1:
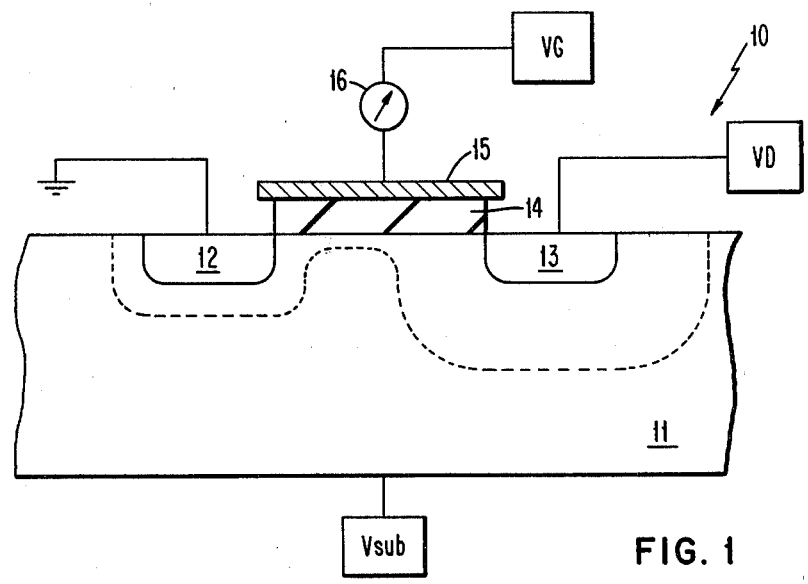
FIG. 1 shows schematically a field effect transistor biased such that hot electrons are injected into the gate oxide.

Hot electrons are injected from the channel into the gate oxide when the device is biased into its normal operating condition. There is illustrated schematically in FIG. 1, and IGFET in the form of a metal oxide semiconductor field effect transistor 10. This transistor 10 comprises a substrate 11 having a diffused source region 12 and a diffused drain region 13 therein. The substrate 11 is based at about 1.5 voltages by source Vsub while source region 12 is connected to ground, i.e. zero volts, and the drain region 13 is connected to a variable voltage source Vd. A gate oxide layer 14 about 400 angstroms thick overlies the region between the source 12 and drain 13. Overlying this gate oxide is a gate electrode 15 which is biased by a variable bias source Vg. An ammeter, 16 is located in the line running from the gate voltage source Vg to the gate 15 so that the gate current can be measured.

When the gate 15 is biased above the threshold voltage of the device and Vd is biased above the source voltage a channel is created between the source and drain and electrons will flow through the channel from source to drain.

Electrons flowing from source to drain are "heated" by the high electric field near the drain, and a small fraction attain enough energy to surmount the energy barrier at the oxide-silicon interface and pass into the silicon oxide layer. The fraction of electrons which is emitted depends strongly on the electric field near the drain and thus on the bias conditions and the device structure. Emission probabilities as low as $10^{-11}$ emitted electrons per channel electron can cause threshold instability in an operating IGFET in 1 minute. Probabilities from $10^{-11}$ to $10^{-14}$ have been observed. Both the emission and the subsequent trapping of the hot electrons are localized near the drain junction.

The effect of hot-electron emission and trapping on the device characteristics are related to the emission current and the electron trapping efficiency. The electron trapping efficiency is a function of the gate insulator material as well as a function of the process steps used during device fabrication.

The hot-electron emission currents, are a function of the hot-electron distribution in the silicon near the Si-SiO₂ interface. This hot-electron distribution depends on the applied voltages, the device parameters such as doping profile, junction depth and channel length, and the ambient temperature. The electrons will attain the highest energies at the point along the channel where the electric field parallel to the direction of current flow is the greatest. This occurs near the drain metallurgical junction. The fraction of channel electrons emitted into the oxide increases with drain bias due to the increased drain-to-channel electric field and the resultant increase in electron effective temperature.

The hot-electron current at the gate depends on both the energy distribution of the electrons within the silicon and the oxide in the region of emission. Hot-electron gate current has been measured on a wide variety of IGFET devices at various bias conditions. Measurements of gate currents between 0.5 fA and 1 pA were made on 10-100 μm wide FET's with an electrometer. The samples were enclosed in a light-tight Faraday shield containing a controlled inert dry atmosphere during measurement. This accomplished several purposes in that the transistor is kept free of extraneous electrical noise, and photo-generated currents and spurious surface currents are avoided. Because the currents to be measured are small it is desirable that all leads to the device be kept short and that the device be mounted on a highly stable platform so that mechanical vibrations are avoided.

At levels greater than about 1 pA, the current decreased significantly during the measurements due to the repulsion field resulting from electron trapping in the oxide. This reduction is caused by the increased barrier height with an increasing trapped charge. Various bias configurations were tried to assure that parasitic surface currents between metallization lands and Fowler-Nordheim tunnel current through the gate insulator did not contribute to the measured gate current.

A summary of six structures characterized is shown in Table I.

TABLE I

| Device | Oxide Thickness (nm) | Junction Depth (μm) | $P_O$ | $\sigma$ (nm) | $C_B$ | $\mu$ (nm) |
|---|---|---|---|---|---|---|
| A | 67 | 1.9 | −0.56 | 360 | 0.76 | −97 |
| B | 50 | 0.8 | 7.6 | 190 | 0.68 | 150 |
| C | 37 | 0.5 | — | — | 0.68 | — |
| D | 31 | 0.2 | 14.5 | 33 | 0.12 | 68 |
| E | 27 | 0.2 | 17.5 | 120 | 0.43 | −65 |
| F | 24 | 0.2 | 10.6 | 110 | 1.1 | −61 |

$P_O = (10^{16} cm^{-3})$ and $C_B = (10^{16} cm^{-3})$

The boron concentration profiles are described by $$C = C_B + P_O \exp[-(y-\mu)^2/2\sigma^2]$$

where y is the depth beneath the oxide gate.

The impurity profiles were measured by the pulse CV technique. Included are source and drain junction depths between 0.2 and 2.0 μm, oxide thicknesses between 25 and 67 nm, and various channel impurity profiles. All gate insulators were dry thermal oxides annealed to achieve minimum charge density.

Figure 2:
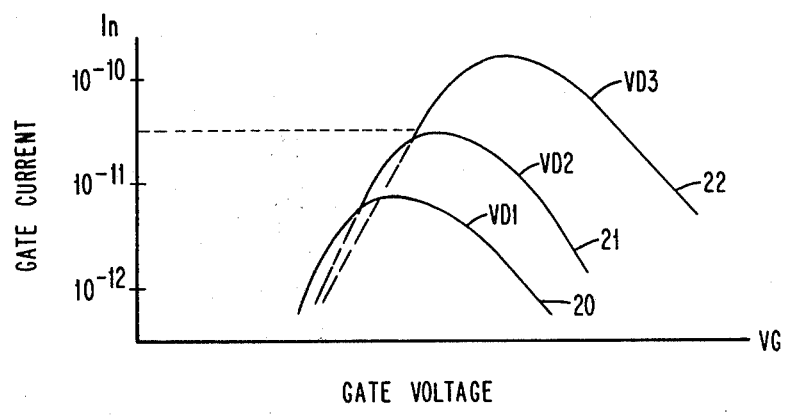
FIG. 2 is a set of curves showing the rate of change in channel current.

The effect of gate and drain bias on hot electron gate current is readily illustrated in FIG. 2.

These curves 20, 21, and 22 were established by first setting VG equal to VD and at a voltage high enough to observe a measurable gate current flow through electrometer 16.

Each curve is related to a case where the gate voltage is greater than the preselected drain voltage, i.e. VD1 for curve 20, VD2 for curve 21 and VD3 for curve 23 where VD2 is greater than VD1 and VD3 is greater than VD2. As shown in this FIG. 2 each curve 20, 21 and 22, represents a different gate current, and increases with increasing drain bias, as long as VD<VG, because the field, heating the electrons, is increasing and emitted electrons are attracted to the gate. When VD>VG, the gate current remains the same or decreases slowly with increasing drain bias. Although the electrons are attaining higher energies with increasing channel field, the increasing repulsion field in the oxide is preventing them from reaching the gate. At a fixed drain bias, increasing gate bias enhances gate current when that increase lowers the repulsion field in the oxide. For VG>VD, all emitted electrons are collected by the gate. In this case, the gate current decreases with increasing gate bias because of the reduction in channel field as the FET goes further into the linear region.

The magnitude of the gate current is also a strong function of channel length. The reduction in gate current with increasing gate bias, in the linear region, is less for shorter channel lengths. This is due to the increasing role of the mobile space charge and source-to-drain spacing in determining the electric field. It was found that source-to-substrate bias has only a minor effect on the hot-electron gate current. The effect of the device structure is shown by comparing the bias required for a fixed gate current as a function of channel length. For a normalized gate current of $10^8$ electrons/cm·s, a current of 0.16 pA occurs in a 100 μm wide device. For structures with shallow junctions and high channel impurity concentrations, the gate current is greater and has less channel-length dependence. A small fraction of the emitted hot-electrons are trapped in the gate oxide. Once the magnitude of the charge is great enough to effect the local electric field, it will cause measurable changes in the IGFET characteristics. First noticed will be a decrease in hot-electron gate current as the bias time increases. This is due to the increase in the local field repelling injected hot-electrons from the oxide. The effect is similar to that of lowering the gate voltage. The trapped charge also causes a distortion of the IGFET turn-on characteristics such that a higher gate bias is required to attain a given source-to-drain current level.

Thus, to measure the gate current of the device the gate voltage Vg is set equal to the drain voltage Vd and both are set high enough to assure Ig is at an easily measured level but not so large as to cause problems. As shown in FIG. 2, the gate current for any particular curve, in this case curve 21, is measured at or near the point where the curve peaks.

Devices with structure E of table I were biased with Vgs=Vds for times ranging from 10 to $10^8$ s. The change in channel current during reverse-mode characterization is shown as a function of bias time in FIG. 3 which shows the fractional decrease in channel current versus time at 1 V above threshold at Vds=0.5 V and Vsx=1.0 V during reverse-mode characterization. Leff=1.1 μm and Weff=11.0 μm.

The time dependence of the gate current characteristics can be explained qualitatively by a simple one-dimensional model. Assuming a Maxwellian hot-electron distribution in the silicon independent of gate bias, the gate current reaching traps at potential V<Vgs can be described by $$Ig = I_0 \exp[-q(V - Vgs)/KT_E]$$

where $T_E$ is the electron temperature and $I_0$ is the initial gate current at time t=0 with V=Vgs=Vds. If the probability of trapping an electron $\eta_t$ is independent of the number trapped, then the total trapped charge is:

$$Q_t = Q_0 \ln\left(1 + \frac{t}{\tau}\right)$$

where t is the time at bias Vds=Vgs, $$Q_0 = CKT_e/q$$

$$\tau = Q_0/\eta_t I_0$$

where K is Boltzmann's constant, q is the electron change magnitude, $\eta_t$ is the trapping efficiency, and C is the capacitance associated with filling the traps. The total gate current is then $$I_g = I_0\left(1 + \frac{t}{\tau}\right)^{-1}.$$

The change in channel current is related to the trapped charge $Q_T$ and the fractional decrease in channel current is proportional to the square of the trapped charge. Thus the fractional charge in channel current is;

$$\frac{\Delta Isd}{Isd} = A\left[C\left(\frac{KTe}{q}\right) \ln\left(1 + \frac{t}{\tau}\right)\right]^2$$

where typically
A=4×10$^{-16}$ (electrons/cm)$^{-2}$
C=6×10$^6$ electrons/cm volt and
KTe/q=0.3 volts This measurement, of the change in gate current with time, can be used to determine the time constant for filling traps and thus as a figure of merit for insulator trapping. In addition, a measurable change in gate current precedes a measurable change in device characteristics by several orders of magnitude in time, as can readily be seen by comparing FIG. 3 to FIG. 4 which illustrates the fractional decrease in gate current at a function of time for the structure shown as E in table I when biased such that Vg=Vd. This is caused by the relative sensitivity of the source-to-drain current to the trapped insulator charge when compared to the sensitivity of gate current. This means that the time-dependent gate current characteristics can be used for predicting the sensitivity of a given device to threshold instabilities caused by hot-electron injection. The initial gate current is a measure of the effect of bias and structure, and the change in gate current with time is a measure of the insulator trapping efficiency.

Thus the long term threshold shift caused by the trapping of low level avalanche injection of hot-electrons in the gate dielectric end of the channel of a IGFET under high drain voltage can be determined in an extremely short period of time. This measured change can now be compared to previously calculated curves and the long term threshold effect predicted.

Because changes in gate current are a more localized effect of the oxide trapping and since the gate current occurs only in the small region of electron emission the effects on gate current are quickly developed due to the change in gate field caused by the presence of electrons in the oxide.

The invention thus teaches that the rate of change of gate current in a device under normal operating conditions can be measured and used to determine and predict the long term threshold shift in device to as to establish the time to a predetermined change in souce drain current.

Figure 3:
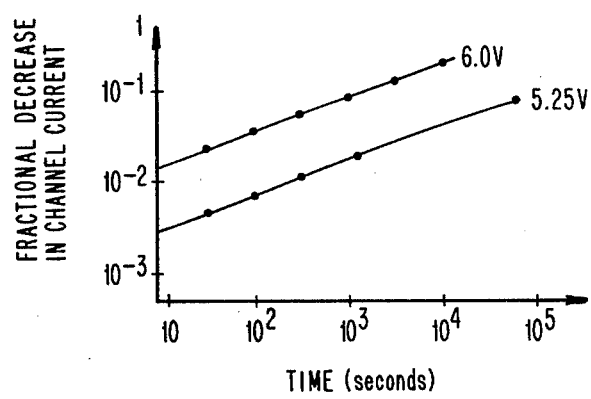
FIG. 3 is a set of curves showing the rate of change in gate current.
Figure 4:
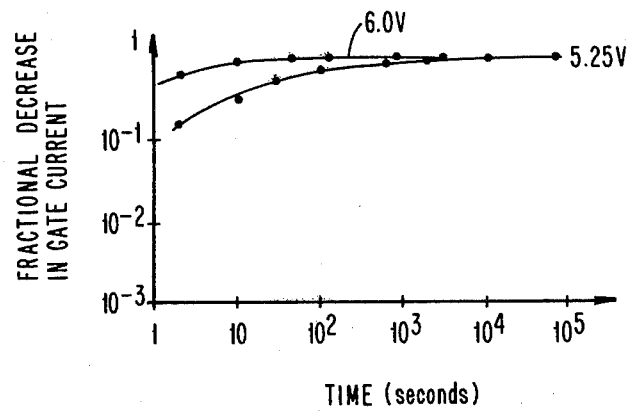
FIG. 4 shows a set of curves of gate current Vs gate voltage for various drain current.

For example, in FIG. 4 a 30% decrease in gate current while the FET is biased with its gate to source voltage and drain to source voltage equal to 5.25 volts occurs in ten seconds or less and corresponds to 0.3% or less change in channel current and since these curves are linear as shown in FIG. 3, the long term behavior of the device can be readily ascertained.

Thus the invention already teaches a method to predict the susceptibility of MOSFET devices to long term changes in threshold voltage in which the rate of change in the initial gate current is measured while the device is biased under normal operating conditions.

Although the invention has been particularly shown and described with reference to a preferred embodiment thereof, it will be understood by those skilled in the art that the foregoing and other changes in form and details may be made therein without departing from the spirit and scope of the invention.

What is claimed is:

1. A method of determining the time to a predetermined threshold shift in an insulating gate field effect transistor due to hot-electron trapping in the gate dielectric comprising:

biasing the gate and drain electrodes of an insulating gate field effect transistor at a constant voltage with respect to the source electrode within the normal operating range, and measuring the decrease in gate current with respect to time, due to hot electron trapping in the gate dielectric, wherein there is determined from said measurement the change in channel current and long term device characteristics.

2. The method of claim 1 wherein said gate voltage is equal to said drain voltage and said measuring is concluded within ten seconds.

3. The method of claim 1 wherein said transistor is enclosed in a light-tight, vibration free enclosure during said measurement.

* * * * *